United States Patent
Yoon et al.

(10) Patent No.: US 7,995,378 B2
(45) Date of Patent: Aug. 9, 2011

(54) MRAM DEVICE WITH SHARED SOURCE LINE

(75) Inventors: Sei Seung Yoon, San Diego, CA (US); Cheng Zhong, San Diego, CA (US); Dongkyu Park, San Diego, CA (US); Mohamed H. Abu-Rahma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 548 days.

(21) Appl. No.: 11/959,515

(22) Filed: Dec. 19, 2007

(65) Prior Publication Data

US 2009/0161413 A1 Jun. 25, 2009

(51) Int. Cl.
*G11C 11/00* (2006.01)
(52) U.S. Cl. ............... 365/158; 365/148; 365/225.5; 365/243.5
(58) Field of Classification Search .............. 365/48, 365/55, 62, 66, 74, 78, 80–93, 100, 130, 365/131, 148, 158, 171–173, 225.5, 243.5; 216/22; 257/3, 421, E21.665; 438/3; 977/933–935
See application file for complete search history.

(56) References Cited

U.S. PATENT DOCUMENTS

| | | | |
|---|---|---|---|
| 6,795,340 B2 | 9/2004 | Sakimura et al. | |
| 6,903,965 B2 | 6/2005 | Ishikawa | |
| 7,016,222 B2 | 3/2006 | Morikawa | |
| 7,095,647 B1 | 8/2006 | Jenne et al. | |
| 7,187,577 B1 * | 3/2007 | Wang et al. | 365/158 |
| 7,272,035 B1 | 9/2007 | Chen et al. | |
| 7,324,366 B2 * | 1/2008 | Bednorz et al. | 365/148 |
| 7,345,912 B2 | 3/2008 | Luo et al. | |
| 2007/0159870 A1 | 7/2007 | Tanizaki et al. | |
| 2007/0164265 A1 * | 7/2007 | Kajiyama | 257/3 |
| 2007/0247893 A1 * | 10/2007 | Bednorz et al. | 365/148 |
| 2007/0279967 A1 * | 12/2007 | Luo et al. | 365/158 |

FOREIGN PATENT DOCUMENTS

EP 0616332 9/1994

OTHER PUBLICATIONS

International Search Report—PCT/US08/087741, International Search Authority—European Patent Office—Mar. 4, 2009.
Written Opinion—PCT/US08/087741, International Search Authority—European Patent Office—Mar. 4, 2009.

* cited by examiner

*Primary Examiner* — Richard Elms
*Assistant Examiner* — Harry W Byrne
(74) *Attorney, Agent, or Firm* — Semion Talpalatsky

(57) ABSTRACT

In a particular embodiment, a memory device includes a first memory cell and a second memory cell. The memory device also includes a first bit line associated with the first memory cell and a second bit line associated with the second memory cell. The memory device also includes a source line coupled to the first memory cell and coupled to the second memory cell.

14 Claims, 5 Drawing Sheets

MRAM DEVICE WITH SHARED SOURCE LINE

I. FIELD

The present disclosure is generally related to a magnetoresistive random access memory (MRAM) device having a shared source line.

II. DESCRIPTION OF RELATED ART

Conventional spin transfer torque magnetoresistive random access memory (STT-MRAM) bit cells include a transistor and a magnetic tunnel junction (MTJ) structure. The basic MTJ structure consists of two magnetic electrodes sandwiching a tunnel barrier layer. The magnetic moment of each magnetic electrode is oriented along a long axis of an elongated element. The parallel and anti-parallel magnetic moment orientation between the two magnetic layers on either side of the tunnel barrier gives rise to two different resistances across the barrier, resulting in two memory states. One of the magnetic electrodes has a magnetic moment direction that can be switched based on an applied current density and direction. The other magnetic electrode has a magnetization that is pinned to a particular direction.

Conventional STT-MRAM bit cells in a memory array are arranged in columns, with individual bit lines and source lines for each column. The bit line and the source line of a particular column provide a bidirectional current path for reading and writing data values to one or more bit cells of the column. A word line is coupled to each row of bit cells to enable a particular row of bit cells to be selected for data read and write operations.

One limitation of conventional STT-MRAM devices is low array density resulting from bit line and source line spacing due to the source line configuration in the memory array. Because STT-MRAM uses bidirectional current to write complementary data, source lines cannot be connected to ground nor shared across an entire array, as is possible in other memory technologies. Instead, conventional MRAM memory arrays have one source line per column, with a corresponding increased area compared to other memory technologies due to the increased number of dense metal lines in the memory array.

III. SUMMARY

In a particular embodiment, a memory device is disclosed. The memory device includes a first memory cell and a second memory cell. The memory device includes a first bit line associated with the first memory cell and a second bit line associated with the second memory cell. The memory device further includes a shared source line that is coupled to the first memory cell and to the second memory cell.

In another embodiment, the memory device includes a first memory cell that includes a first magnetic tunnel junction (MTJ) device and a first transistor. The memory device also includes a second memory cell that includes a second MTJ device and a second transistor. The memory device includes a first conductor coupled to a first gate terminal of the first transistor and coupled to a second gate terminal of the second transistor. The memory device further includes a second conductor coupled to a first source terminal of the first transistor and coupled to a second source terminal of the second transistor.

In another embodiment, the memory device includes a first memory cell that includes a first MTJ device and a second MTJ device. The memory device also includes a second memory cell that includes a third MTJ device and a fourth MTJ device. The memory device includes a first bit line associated with the first memory cell and a second bit line associated with the second memory cell. The memory device further includes a source line coupled to the first memory cell and coupled to the second memory cell.

In another embodiment, a method of using a shared source line coupled to multiple units of a memory device is disclosed. The method includes applying a current to a source line during a data operation of the memory device. The source line is coupled to a first data storage unit and to a second data storage unit of the memory device.

One particular advantage provided by the disclosed embodiments is reduced device area. Fewer lines are required to access cells of a MTJ memory array and therefore less device area is reserved for separation between lines. Array density may be increased since fewer lines are required. Another advantage is simplified source line routing due to a reduced number of source lines. The MRAM devices of the disclosed embodiments may be smaller than comparable SRAM devices and may be less expensive to manufacture. In addition, the MRAM devices of the disclosed embodiments may be faster than comparable flash memory devices.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
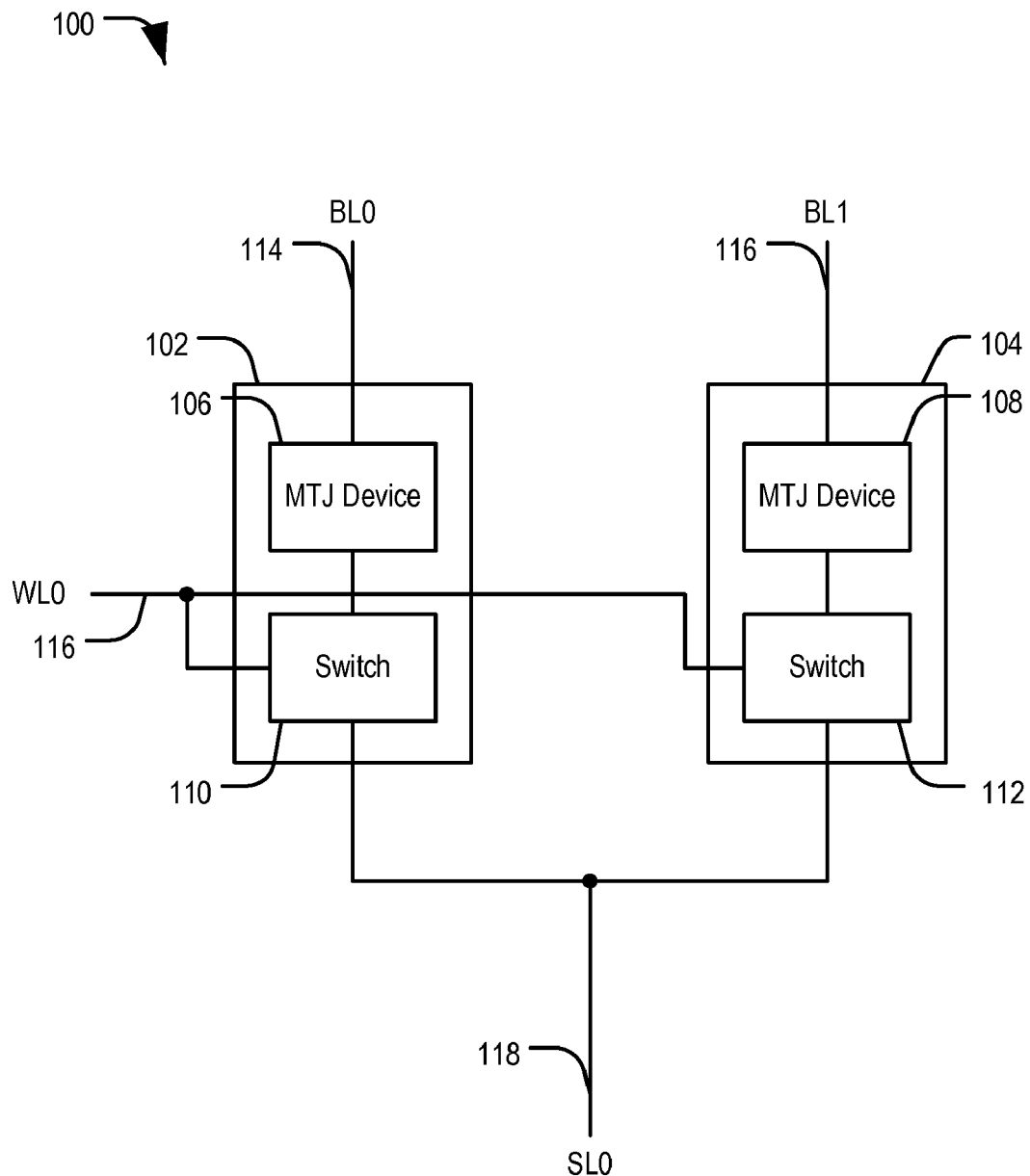
FIG. 1 is a block diagram of a particular illustrative embodiment of an MRAM device with a shared source line.

Referring to FIG. 1, a block diagram of a particular illustrative embodiment of an MRAM device with a shared source line is depicted and generally designated 100. The device 100 includes a first representative memory cell 102 and a second representative memory cell 104. A first bit line (BL0) 114 is coupled to the first memory cell 102. A second bit line (BL1) 116 that is distinct from the first bit line 114 is coupled to the second memory cell 104. A shared source line (SL0) 118 is coupled to the first memory cell 102 and to the second memory cell 104. A word line (WL0) 116 is coupled to the first memory cell 102 and the second memory cell 104.

The first memory cell 102 includes a magnetic tunnel junction (MTJ) device 106 coupled to the first bit line 114. The MTJ device 106 is also coupled to a switch 110, such as a transistor. The switch 110 is configured to selectively couple the MTJ device 106 to the source line 118 in response to a control signal received via the word line 116.

In a particular embodiment, the MTJ device 106 is a spin transfer torque (STT) device that is adapted to store a programmable magnetic field in a direction that is parallel or antiparallel to a reference field. When the magnetic fields are parallel, the MTJ device 106 exhibits a lower resistance than when the magnetic fields are antiparallel. A data value (e.g., a "0" or "1") that is stored at the MTJ device 106 corresponds to the parallel or antiparallel state of the magnetic fields, which may be determined by the resulting resistance of the MTJ device 106.

The second memory cell 104 includes a magnetic tunnel junction (MTJ) device 108 coupled to the second bit line 116. The MTJ device 108 is also coupled to a switch 112, such as a transistor. The switch 112 is configured to selectively couple the MTJ device 108 to the shared source line 118 in response to a control signal received via the word line 116.

In a particular embodiment, the MTJ device 108 is a STT device that is adapted to store a programmable magnetic field in a direction that is parallel or antiparallel to a reference field. A data value (e.g., a "0" or "1") that may be stored at the MTJ device 108 corresponds to the parallel or antiparallel state of the magnetic fields, which may be determined by the resulting resistance of the MTJ device 108.

During operation, data may be read from or written to the first memory cell 102 or the second memory cell 104 using the associated bit lines 114, 116 and the common (i.e., shared) source line 118. Data may be read by applying a potential difference between the source line 118 and the respective bit line 114 or 116 that is associated with the selected memory cell 102 or 104. A control signal may be sent via the word line 116 to enable current to flow through the switches 110, 112. The resulting current through the source line 118 or through the associated bit line 114 or 116 may be compared to a reference current to determine a data value at the selected memory cell 102 or 104. Data may also be stored at the selected memory cell 102 or 104 by applying a current that is large enough to change the direction of the programmable magnetic field of the respective MTJ device 106 or 108 of the selected memory cell 102 or 104.

During a read operation of the first memory cell 102, the first bit line 114 carries a first voltage, the second bit line 116 carries a second voltage, and the source line 118 carries a third voltage. To prevent the second memory cell 104 from introducing current to the source line 118, the second voltage at the second bit line 116 may be the same as the third voltage at the source line 118. In a particular embodiment, the second bit line 116 and the source line 118 are biased such that a difference between the second voltage and the third voltage is not large enough to disturb the second memory cell 104.

In an alternative embodiment, separate word lines (not shown) may be coupled to the first memory cell 102 and the second memory cell 104 to independently operate the switches 110, 112 and to selectively activate or deactivate data operations at the memory cells 102, 104. Current may be applied to the source line 118 and a resulting voltage at the bit line 114 or 116 of the activated memory cell 102 or 104 may be compared to a reference voltage to determine a data value stored at the activated (i.e., selected) memory cell 102 or 104.

Figure 2:
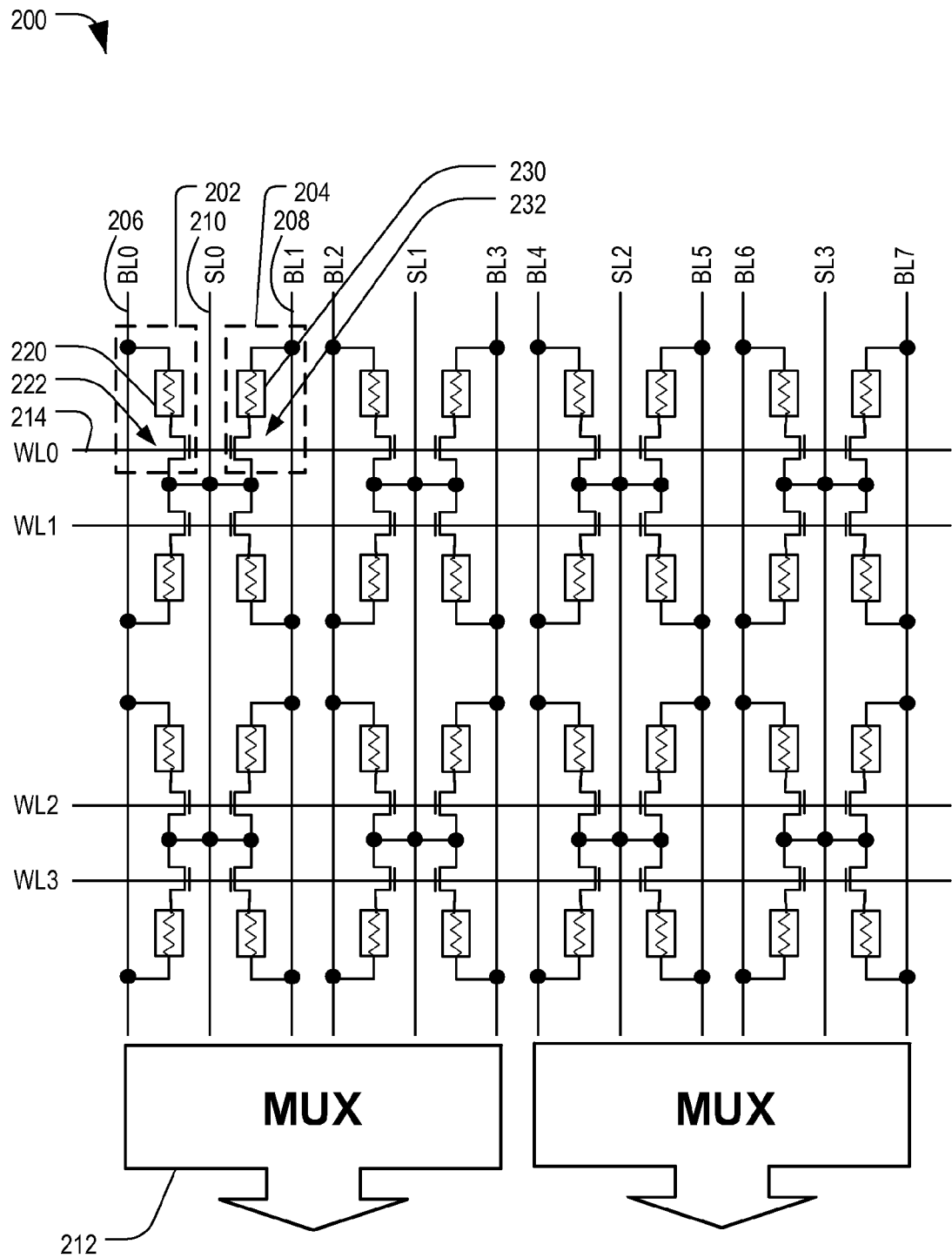
FIG. 2 is a diagram of a second illustrative embodiment of an MRAM device with a shared source line.

Referring to FIG. 2, a diagram of a second illustrative embodiment of an MRAM device with a shared source line is depicted and generally designated 200. The device 200 includes a first representative memory cell 202 and a second representative memory cell 204. Memory cells are selected and memory operations are performed via signals at various conductors, such as a representative first bit line (BL0) 206, a second bit line (BL1) 208, a source line (SL0) 210, and a word line (WL0) 214. A first column of memory cells including the first memory cell 202 shares the source line 210 with a second column of memory cells including the second memory cell 204. One or more multiplexers, such as a representative multiplexer 212, are coupled to the bit lines and source lines.

The first memory cell 202 includes a first magnetic tunnel junction (MTJ) device 220 that is coupled to the first bit line 206 and to a first transistor 222. The second memory cell 204 includes a second MTJ device 230 that is coupled to the second bit line 208 and to a second transistor 232. A first source terminal of the first transistor 222 and a second source terminal of the second transistor 232 are each coupled to the source line 210. A first gate terminal of the first transistor 222 and a second gate terminal of the second transistor 232 are each coupled to the word line 214.

A read or write operation may be performed at a selected cell, such as the first memory cell 202 associated with the first bit line 206 and the source line 210. The multiplexer 212 connects the first bit line 206 and the source line 210 to read or write circuitry (not shown). Because the first memory cell 202 shares the source line 210 with the second memory cell 204, when a read operation is performed, the read circuitry may tie the second bit line 208 to the same voltage level as the source line 210 to prevent unwanted operation at the second memory cell 204. For example, the read circuitry may couple the first bit line 206 to a supply voltage and may couple both the source line 210 and the second bit line 208 prior to sending an activation signal to the word line 214.

To perform a read operation at the first memory cell 202, the first bit line 206 may be biased with a read voltage level, and the source line 210 and the second bit line 208 may be tied to a different voltage level. A control voltage may be applied to the word line 214 to activate the corresponding row of memory cells, including the memory cells 202 and 204. The voltage difference between the first bit line 206 and the source line 210 causes current to flow through the first bit line 206, the first MTJ device 220, the first switch 222, and the source line 210. The current may be compared to a reference current to determine whether a "0" value or a "1" value is stored at the first memory cell 202.

To perform a read operation at the second memory cell 204, the first bit line 206 may be biased at substantially the same voltage level as the source line 210, and the second bit line 208 may be biased at a read voltage level. The resulting current on the second bit line 208 or the source line 210 may be compared to the reference current to determine a data value stored at the second memory cell 204.

Write operations may be performed by selecting a row via a word line and applying a write current to a selected bit line. For example, a write operation may be performed at the first memory cell 202 by selecting the word line 214 and applying a current to the first bit line 206, with a return path via the source line 210. A direction of the current between the first bit line 206 and the source line 210 determines the data value written to the selected cell 202. The source line 210 is active during read operations and during write operations at both the first column of memory cells including the first memory cell 206 and the second column of memory cells including the second memory cell 208.

Figure 3:
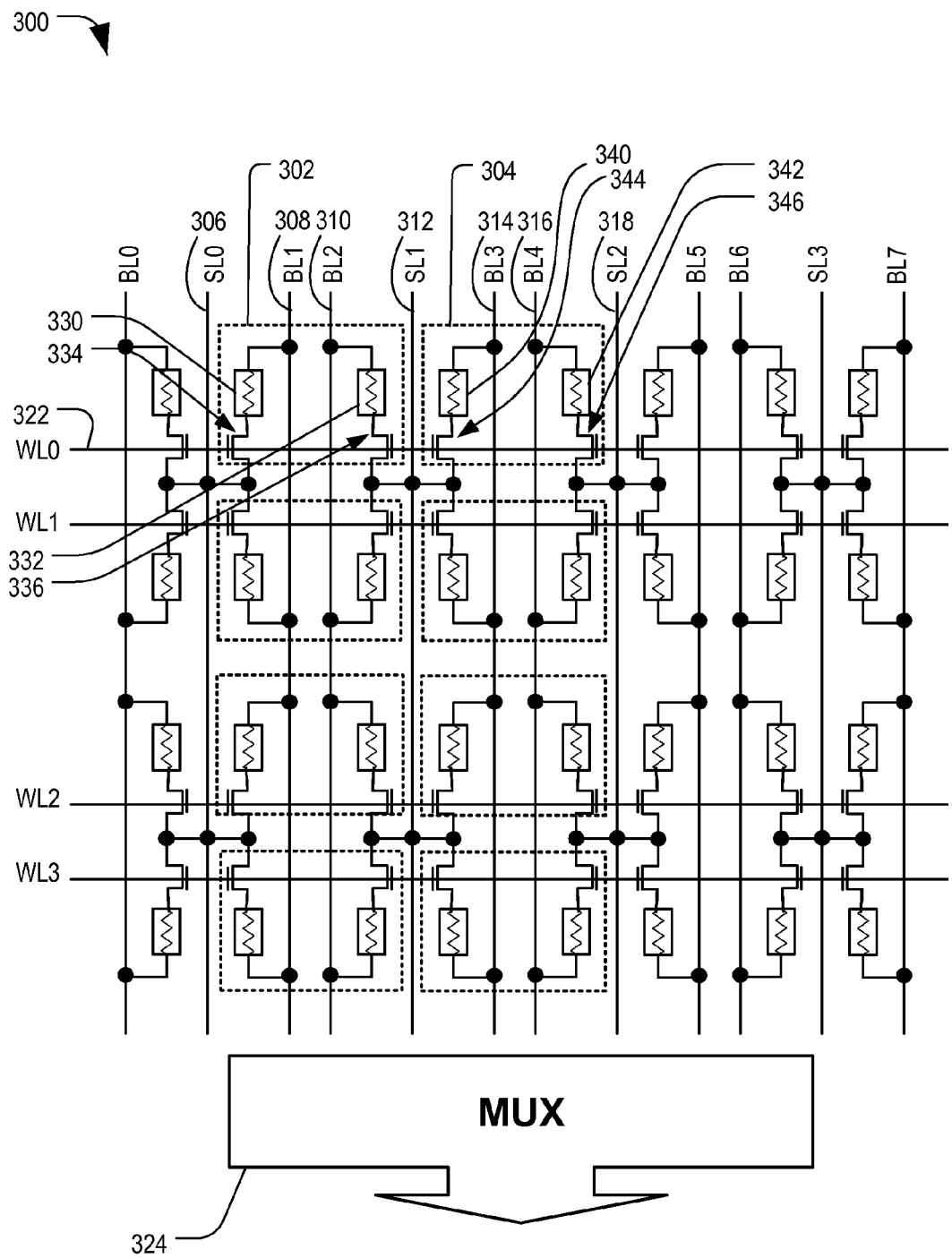
FIG. 3 is a diagram of a third illustrative embodiment of an MRAM device with a shared source line.

Referring to FIG. 3, a diagram of a third illustrative embodiment of an MRAM device with a shared source line is depicted and generally designated 300. The device 300 includes an array of memory cells, such as a first representative memory cell 302 and a second representative memory cell 304. A first source line (SL0) 306, a first bit line (BL1) 308, and a second bit line (BL2) 310 are coupled to the first memory cell 302. A second source line (SL1) 312 is coupled to the first memory cell 302 and to the second memory cell 304. A third bit line (BL3) 314, a fourth bit line (BL4) 316, and a third source line (SL2) 318 are coupled to the second memory cell 304. The first memory cell 302 and the second memory cell 304 are each coupled to a word line (WL0) 322.

A multiplexer 324 is coupled to bit lines and source lines associated with multiple memory cells of the array.

The first memory cell 302 includes a first magnetic tunnel junction (MTJ) device 330 and a second MTJ device 332. A first transistor 334 is coupled to the first MTJ device 330 and a second transistor 336 is coupled to the second MTJ device 332. At least one of the transistors 334 and 336 is coupled to the second source line 312, which is shared with the second memory cell 304. As depicted, the first source line 306 is coupled to the first transistor 334 and the second source line 312 is coupled to the second transistor 336. The word line 322 is coupled to a control terminal of each of the first and second transistors 334, 336. In a particular embodiment, the first memory cell 302 operates as a complementary device cell, with the first MTJ device 330 and the second MTJ device 332 storing complementary data values.

The second memory cell 304 includes a third MTJ device 340 and a fourth MTJ device 342. A third transistor 344 is coupled to the third MTJ device 340 and a fourth transistor 346 is coupled to the fourth MTJ device 342. At least one of the transistors 344 and 346 is coupled to the second source line 312, which is shared with the first memory cell 302. As depicted, the second source line 312 is coupled to the third transistor 344 and the third source line 318 is coupled to the fourth transistor 346. The word line 322 is coupled to a control terminal of each of the third and fourth transistors 344, 346. In a particular embodiment, the second memory cell 304 operates as a complementary device cell, with the third MTJ device 340 and the fourth MTJ device 342 storing complementary data values.

In a particular embodiment, a read operation may be performed at the first memory cell 302 by selecting the first row of memory cells via the word line 322. A control signal applied to the word line 322 enables a current path through each of the MTJ devices in the associated row, including the MTJ devices 330, 332, 340, and 342. Read circuitry (not shown) at the multiplexer 324 applies a first set of read signals to the first source line 306 and the first bit line 308 to read a first data value stored at the first MTJ device 330. The read circuitry of the multiplexer 324 also applies a second set of read signals to the second source line 312 and to the second bit line 310 to read a second data value stored at the second MTJ device 332.

In a particular embodiment, the read signals may include a voltage difference applied across the bit lines and the source lines. Because the second memory cell 304 shares the second source line 312 with the first memory cell 302, at least the third bit line 314 is set to the same voltage as the second source line 312 to prevent an additional current path to or from the second source line 312 through the third MTJ device 340.

In a particular embodiment, the read circuitry compares the current through the first bit line 308 to the current through the second bit line 310 to determine a data value stored at the first memory cell 302. Using the complementary MTJ devices 330 and 332 in the first memory cell 302 enables a stored data value to be determined without generating a reference current or voltage for comparison.

In a particular embodiment, a write operation may be performed at the first memory cell 302 by applying a control signal to the word line 322 to enable a current path through each of the MTJ devices in the associated row, including the MTJ devices 330, 332, 340, and 342. Write circuitry (not shown) at the multiplexer 324 applies a first set of write signals to the first source line 306 and to the first bit line 308 to write a first data value at the first MTJ device 330. The write circuitry also applies a second set of write signals to the second source line 312 and to the second bit line 310 to write a complementary data value at the second MTJ device 332. At least the third bit line 314 is set to the same voltage as the second source line 312 to prevent an additional current path to or from the second source line 312 through the third MTJ device 340.

Figure 4:
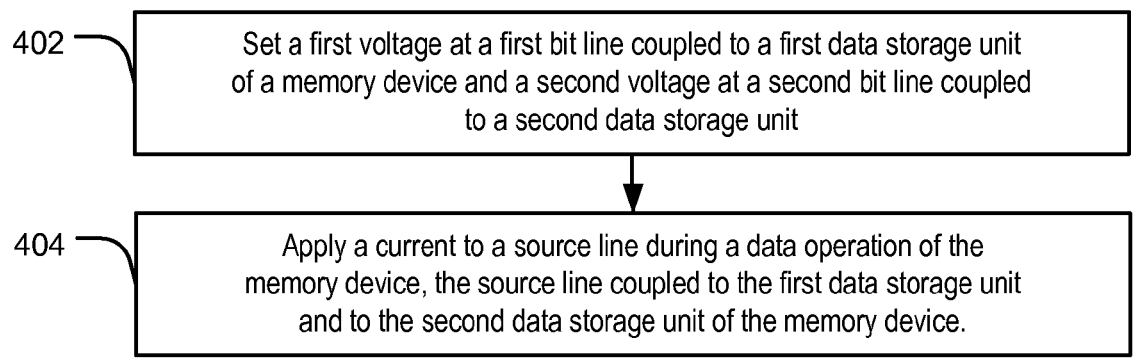
FIG. 4 is a flow chart of a particular illustrative embodiment of method of using a shared source line coupled to multiple units of a memory device.

Referring to FIG. 4, a flow chart of a particular illustrative embodiment of a method of using a shared source line with multiple units of a memory device is depicted. At 402, in a particular embodiment, a first voltage is set at a first bit line coupled to a first data storage unit of a memory device and a second voltage is set at a second bit line coupled to a second data storage unit of the memory device. In an illustrative embodiment, the first and second data storage units may be memory cells of the devices illustrated in FIGS. 1-3.

Moving to 404, a current is applied to a source line during a data operation of the memory device. The source line is coupled to the first data storage unit and to the second data storage unit of the memory device. The current may be provided to the source line via a current source or may be generated at the source line in response to a potential difference between the source line and a bit line of the memory device. In a particular embodiment, the data operation is a data read operation or a data write operation. Outputs of the first data storage unit and the second data storage unit may be provided to a multiplexer.

In a particular embodiment, the first data storage unit is a first memory cell including a single magnetic tunnel junction (MTJ) device. In another particular embodiment, the first data storage unit is a combined cell that includes multiple complimentary MTJ devices. The multiple complimentary MTJ devices include a first MTJ device to store a first data item and a second MTJ device to store a second data item.

Figure 5:
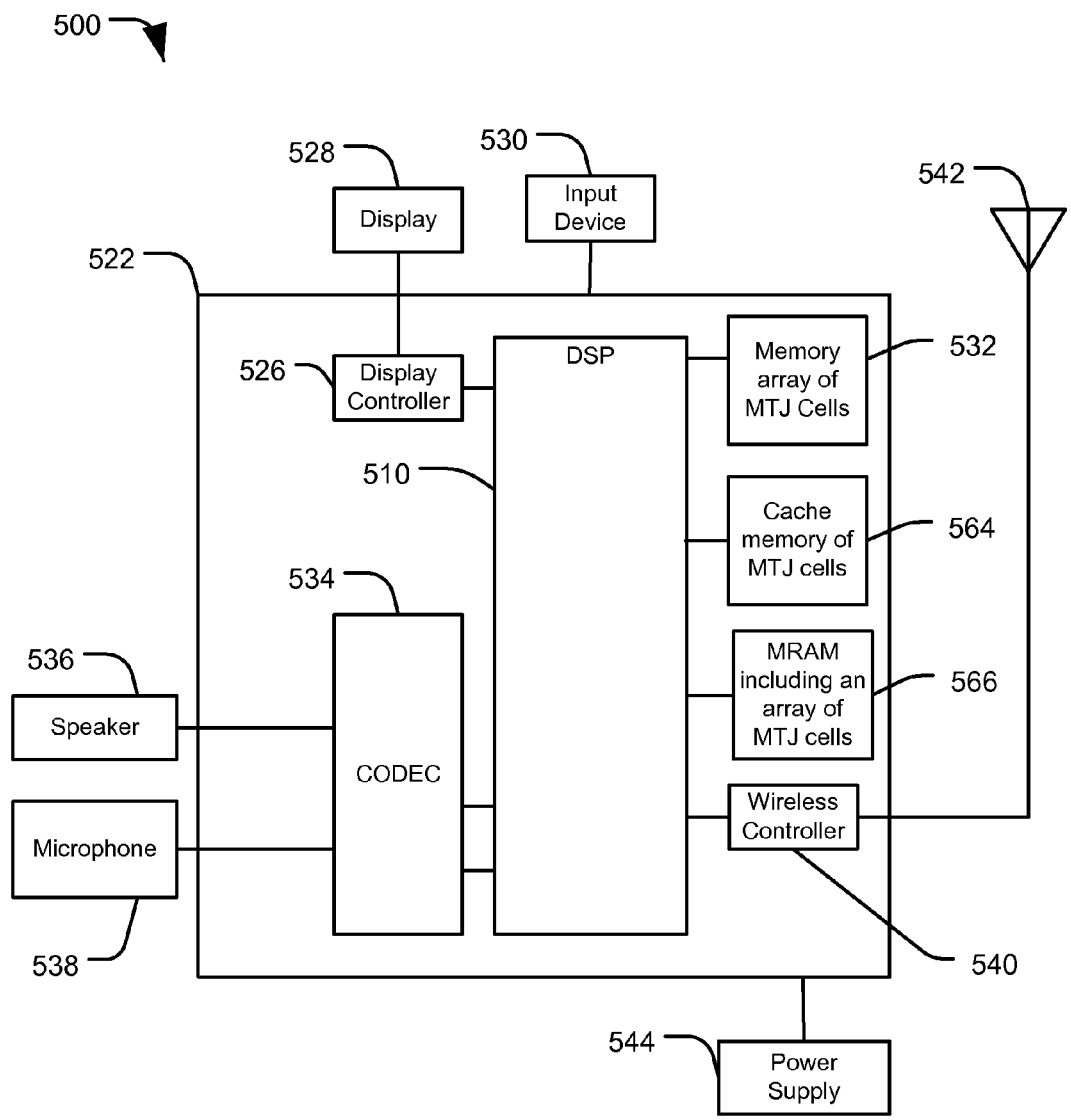
FIG. 5 is a block diagram of a communications device including a memory device that includes multiple magnetic tunnel junction (MTJ) cells.

FIG. 5 is a block diagram of a communications device 500 including a memory device that includes multiple magnetic tunnel junction (MTJ) cells. The communications device 500 includes a memory array of MTJ cells 532 and a cache memory of MTJ cells 564, which are coupled to a processor, such as a digital signal processor (DSP) 510. The communications device 500 also includes a magneto-resistive random access memory (MRAM) device 566 that is coupled to the DSP 510. In a particular example, one or more of the memory array of MTJ cells 532, the cache memory of MTJ cells 564, and the MRAM device 566 are implemented as devices that include multiple MTJ cells that share source lines to reduce MRAM array area, as described with respect to FIGS. 1-4.

FIG. 5 also shows a display controller 526 that is coupled to the digital signal processor 510 and to a display 528. A coder/decoder (CODEC) 534 can also be coupled to the digital signal processor 510. A speaker 536 and a microphone 538 can be coupled to the CODEC 534.

FIG. 5 also indicates that a wireless controller 540 can be coupled to the digital signal processor 510 and to a wireless antenna 542. In a particular embodiment, an input device 530 and a power supply 544 are coupled to the on-chip system 522. Moreover, in a particular embodiment, as illustrated in FIG. 5, the display 528, the input device 530, the speaker 536, the microphone 538, the wireless antenna 542, and the power supply 544 are external to the on-chip system 522. However, each can be coupled to a component of the on-chip system 522, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A memory device comprising:
    a first memory element having a first memory element first terminal and a first memory element second terminal;
    a second memory element having a second memory element first terminal and a second memory element second terminal;
    a first bit line coupled to the first memory element at the first memory element first terminal, the first bit line biased to a first voltage;
    a second bit line coupled to the second memory element at the second memory element first terminal, the second bit line biased to a second voltage that is independent of the first voltage; and
    a source line, the source line biased to the second voltage;
    wherein upon activation of a first switch the source line is coupled to the first memory element at the first memory element second terminal and wherein upon activation of a second switch the source line is coupled to the second memory element at the second memory element second terminal.

2. The memory device of claim 1, wherein each of the first memory element and the second memory element includes a respective magnetic tunnel junction (MTJ) device.

3. The memory device of claim 1, further comprising a word line coupled to the first switch and to the second switch, wherein upon application of a predefined voltage to the word line, the first switch is activated and the second switch is activated.

4. The memory device of claim 1, wherein, during a read of the first memory element, the first switch is activated and the second switch is activated.

5. The memory device of claim 1, further comprising:
    a first word line configured to selectively activate the first memory element but not the second memory element; and
    a second word line configured to selectively activate the second memory element but not the first memory element.

6. The memory device of claim 1, wherein data stored in the first memory element is read by:
    activation of the first switch and the second switch via a control signal sent via a word line; and
    upon activation of the first switch and the second switch, comparison of a current flowing through the source line to a reference current.

7. The memory device of claim 1, wherein data is stored in the first memory element by:
    activation of the first switch via a control signal sent via a word line; and
    application of an electrical current to the source line after the activation of the first switch, wherein a magnitude of the electrical current exceeds a threshold magnitude associated with a change in direction of a programmable magnetic field of a magnetic tunnel junction (MTJ) device associated with the first memory element.

8. The memory device of claim 1, wherein the first voltage differs from the second voltage during a read operation of the first memory element.

9. The memory device of claim 1, wherein the first voltage differs from the second voltage during a write operation to the first memory element.

10. A memory device comprising:
    a first memory element, wherein the first memory element is coupled to a first bit line and the first memory element is coupleable to a source line;
    a second memory element, wherein the second memory element is coupled to a second bit line and the second memory element is coupleable to the source line; and
    circuitry to perform a read operation with respect to the first memory element by:
        coupling the source line to the first memory element and to the second memory element;
        providing a first voltage to the first bit line;
        providing a second voltage to the second bit line, wherein the second voltage differs from the first voltage; and
        providing the second voltage to the source line.

11. The memory device of claim 10, wherein the first memory element comprises:
  a first memory element first terminal, wherein the first memory element is coupled to the first bit line via the first memory element first terminal; and
  a first memory element second terminal, wherein the first memory element is coupleable to the source line via the first memory element second terminal.

12. The memory device of claim 10, wherein the second memory element comprises:
  a second memory element first terminal, wherein the second memory element is coupled to the second bit line via the second memory element first terminal; and
  a second memory element second terminal, wherein the second memory element is coupleable to the source line via the second memory element second terminal.

13. The memory device of claim 10, wherein the circuitry is operable to couple the source line to the first memory element by actuating a first switch and wherein the circuitry is operable to couple the source line to the second memory element by actuating a second switch.

14. The memory device of claim 10, wherein the first memory element comprises a first magnetic tunnel junction (MTJ) device and wherein the second memory element comprises a second MTJ device.

* * * * *